(12) United States Patent
Kimura

(10) Patent No.: US 7,443,256 B2
(45) Date of Patent: Oct. 28, 2008

(54) OSCILLATOR CIRCUIT WITH A VOLTAGE RESTRICTION BLOCK

(75) Inventor: Hiroyuki Kimura, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 7 days.

(21) Appl. No.: 11/775,230

(22) Filed: Jul. 10, 2007

(65) Prior Publication Data

US 2008/0007350 A1      Jan. 10, 2008

(30) Foreign Application Priority Data

Jul. 10, 2006  (JP) .............................. 2006-189731

(51) Int. Cl.
  *H03K 3/282*  (2006.01)
(52) U.S. Cl. .................... 331/113 R; 331/144
(58) Field of Classification Search ............. 331/113 R, 331/144
  See application file for complete search history.

(56) References Cited

U.S. PATENT DOCUMENTS

| | | | |
|---|---|---|---|
| 5,491,456 A | * | 2/1996 | Kay et al. ..................... 331/57 |
| 5,867,070 A | | 2/1999 | Park |
| 5,896,070 A | | 4/1999 | Tchamov et al. |
| 5,994,972 A | | 11/1999 | Katsui |
| 6,157,268 A | | 12/2000 | Ueno |
| 6,198,358 B1 | | 3/2001 | Tchamov et al. |

FOREIGN PATENT DOCUMENTS

| | | |
|---|---|---|
| JP | 6006187 A | 1/1994 |
| JP | 2005167752 A | 6/2005 |

* cited by examiner

*Primary Examiner*—Joseph Chang
(74) *Attorney, Agent, or Firm*—Charles Bergere

(57) ABSTRACT

An oscillator circuit having a relatively simple circuit structure while enabling full swing with low power consumption includes an oscillation core block, a voltage restriction block, and a differential output block. Drain terminals of first and second transistors are each connected to the voltage restriction block. The voltage restriction block restricts the amplitude of an oscillation signal to a reference voltage. Source terminals of third and fourth transistors are connected to drain terminals of fifth and sixth transistors, and source terminals of seventh and eighth transistors are connected to drain terminals of ninth and tenth transistors. This supplies the differential output block with current generated by the amplitude restriction. The differential output block converts the current into drive voltage to ground voltage to perform full swing.

5 Claims, 6 Drawing Sheets

OSCILLATOR CIRCUIT WITH A VOLTAGE RESTRICTION BLOCK

BACKGROUND OF THE INVENTION

The present invention relates to an oscillator for a semiconductor integrated circuit.

A multivibrator circuit is known in the prior art as an oscillator circuit that alternately activates and inactivates two transistors. Further, for an oscillator circuit incorporating an emitter-coupled multivibrator, an oscillation control circuit has been proposed to output a stable oscillation frequency by reducing the influence of temperature dependency and variation between lots on the base-emitter potential difference (for example, refer to Japanese Laid-Open Patent Publication No. 2005-167752, FIG. 1). In the oscillator circuit described in Japanese Laid-Open Patent Publication No. 2005-167752, common current flows through transistors that determine the oscillation frequency. This suppresses the influence of the base-emitter voltage difference. Further, as for current determined by a resistor that controls the dynamic range or the like, an emitter follower is used to suppress the base-emitter voltage difference of transistors determined by this current.

Further, an emitter-coupled multivibrator oscillation circuit having a relatively small circuit scale and eliminating the need for an external amplification circuit, which consumes a large amount of power, has been proposed (for example, refer to Japanese Laid-Open Patent Publication No. 6-6187, FIG. 1). In the oscillator circuit described in Japanese Laid-Open Patent Publication No. 6-6187, an AC-coupling capacitor is connected to the output side of the oscillator circuit, and one or more amplification circuits, each formed by a self-biased CMOS inverter, are connected to the AC-coupled capacitor. The self-biased CMOS inverter includes two conductive MOSFETS, which are connected in series between a power supply and ground. The MOSFETs have gates connected to each other. A bias resistor is connected to a node between the MOSFETs. Further, the self-biased CMOS inverter has a gate area determined so that through current, which is generated when the two conductive MOSFETs are switched, is regulated to a predetermined value.

However, the swing of an oscillator circuit formed by a CMOS transistor is small. Particularly, a high frequency would affect the operation speed and parasitic capacitance of the transistor. As a result, the oscillation amplitude decreases in inverse proportion to the frequency. For example, in the oscillator circuit described in Japanese Laid-Open Patent Publication No. 2005-167752, the amplitude voltage is expressed by "R3*I2." Thus, full swing cannot be performed and amplification is necessary. Accordingly, an amplifier for realizing full swing is necessary for the multivibrator. This results in the necessity for bias current. The oscillator circuit described in Japanese Laid-Open Patent Publication No. 6-6187 includes an amplification circuit and is thus capable of full swing. However, the amplification circuit increases power consumption. In this case, when the amplitude is small, the amplification gain and accuracy must be increased. This requires a larger amount of current.

SUMMARY OF THE INVENTION

The present invention provides an oscillation circuit having a relatively simple circuit structure while enabling full swing with low power consumption.

One aspect of the present invention is an oscillation circuit including an oscillation unit for outputting a first oscillation signal. A voltage control unit includes first and second control elements having source terminals that are connected to each other. An output unit includes first and second output control elements, arranged between first and second output current sources, and a first output terminal arranged at a connection node between the first and second output control elements. The first control element has a drain terminal connected to a connection node between the first output current source and the first output control element. The second control element has a drain terminal connected to a connection node between the second output control element and the second output current source. A connection node between the source terminal of the first control element and the source terminal of the second control element is connected so as to receive the first oscillation signal from the oscillation unit. The first control element has a gate terminal for receiving a predetermined bias, and the second control element has a gate terminal for receiving a reference voltage for determining an amplitude of an oscillation signal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
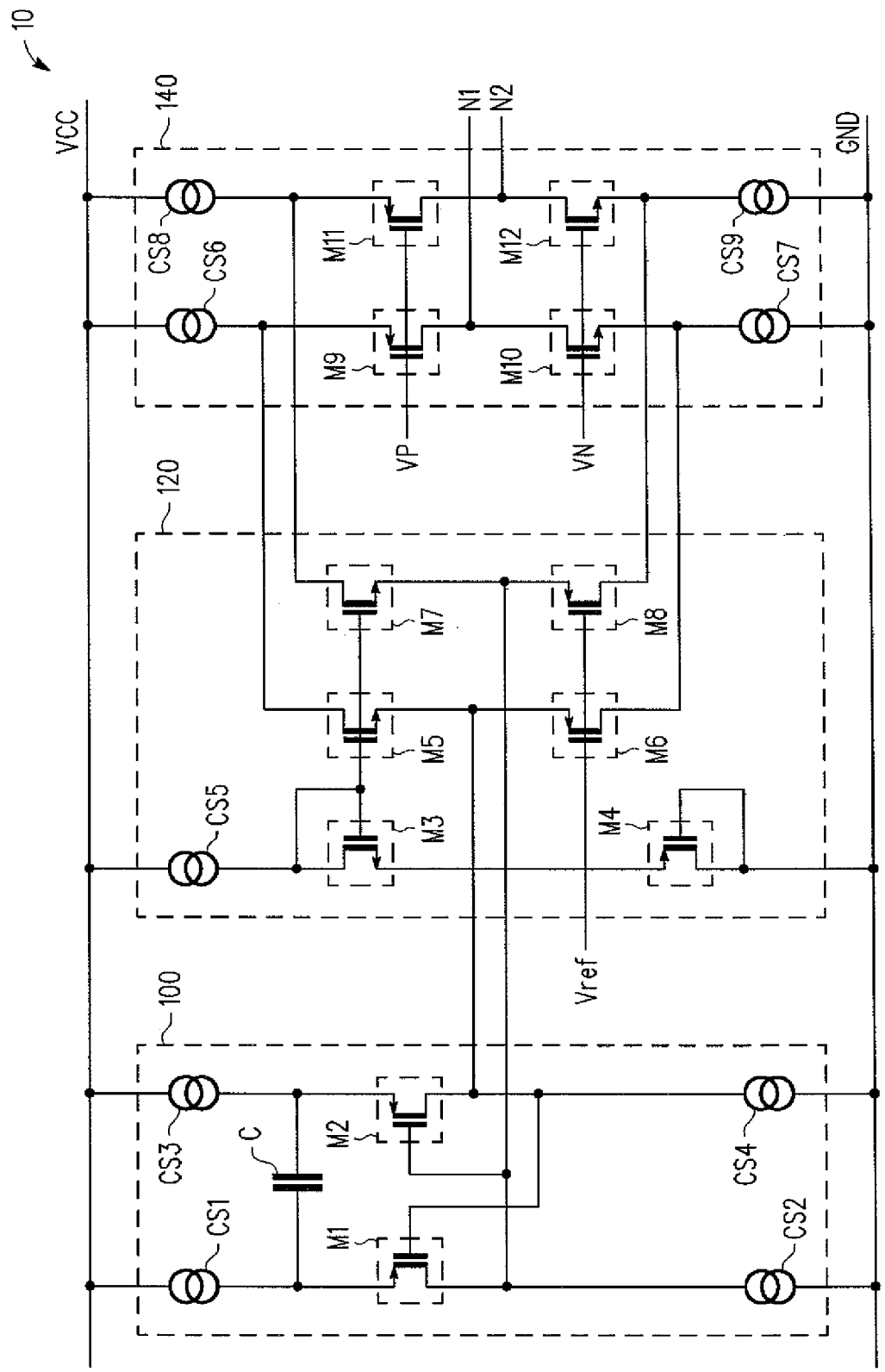
FIG. 1 is a diagram showing the entire structure of an oscillation circuit according to a preferred embodiment of the present invention.

An oscillation circuit 10 according to a preferred embodiment of the present invention will now be discussed with reference to FIGS. 1 to 4. As shown in FIG. 1, the oscillation circuit 10 includes an oscillation core block 100 functioning as an oscillation unit, a voltage restriction block 120 functioning as a voltage control unit, and a differential output block 140 functioning as an output unit. The oscillation core block 100 is a functional block for outputting AN oscillation signal. The voltage restriction block 120 is a functional block for maintaining the oscillation signal of the oscillation core block 100 at a constant output voltage (amplitude) and outputting current that is generated when the voltage is restricted. The differential output block 140 is a functional block for oscillating the current output from the voltage restriction block 120 with an amplitude between the power supply voltage and ground voltage (full swing).

The oscillation circuit 10 is supplied with drive voltage VCC via a power supply line and ground voltage GND via a ground line.

The structure of the oscillation core block 100 will now be discussed.

Referring to FIG. 1, the oscillation core block 100 includes p-channel MOS transistors M1 and M2 respectively functioning as first and second oscillation control elements. The transistor M1 has a source terminal connected to the power supply line via a constant current source CS1, which functions as a first oscillation current source, and a drain terminal connected to the ground line via a constant current source CS2, which functions as a second oscillation current source. The transistor M2 has a source terminal connected to the power supply line via a constant current source CS3, which functions as a third oscillation current source, and a drain terminal connected to the ground line via a constant current source CS4, which functions as a fourth oscillation current source.

The gate terminal of the transistor M1 is connected to the drain terminal of the transistor M2. The gate terminal of the transistor M2 is connected to the drain terminal of the transistor M1.

A capacitor is arranged between the source terminals of the transistors M1 and M2.

The drain terminals of the transistors M1 and M2 are each connected to the voltage restriction block 120. The transistor M1 outputs a first oscillation signal, and the transistor M2 outputs a second oscillation signal.

The structure of the voltage restriction block 120 will now be discussed.

The voltage restriction block 120 includes transistors M3, M5, and M7 of a predetermined conduction type (n-channel) and transistors M4, M6, and M8 of an opposite conduction type (p-channel). The transistors M7 and M8, which are provided with the first oscillation signal, respectively function as first and second control elements. The transistors M5 and M6, which are provided with the second oscillation signal, respectively function as third and fourth control elements.

The drain terminal of the transistor M3 is connected to the power supply line via a constant current source CS5. The drain terminal and gate terminal of the transistor M3 are connected to each other. The source terminal of the transistor M3 is connected to the source terminal of the transistor M4. The drain terminal and gate terminal of the transistor M4 is connected to the ground line. The transistors M3 and M4 generate a predetermined bias voltage relative to the ground voltage GND at the gate terminal of the transistor M3.

The gate terminal of the transistor M3 is connected to the gate terminals of the transistors M5 and M7. The drain terminals of the transistors M5 and M7 are connected to the differential output block 140.

The source terminals of the transistors M5 and M7 are respectively connected to the source terminals of the transistors M6 and M8. A connection node between the transistors M5 and M6 is connected to the drain terminal of the transistor M2 in the oscillation core block 100.

A connection node between the transistors M7 and M8 is connected to the drain terminal of the transistor M1 in the oscillation core block 100.

Further, the gate terminals of the transistors M6 and M8 are supplied with a reference voltage Vref. The reference voltage Vref determines the amplitude of the oscillation signal in the voltage restriction block 120.

The structure of the differential output block 140 will now be discussed.

The differential output block 140 includes transistors M9 and M11 of a predetermined conduction type (p-channel) and transistors M10 and M12 of an opposite conduction type (n-channel). The source terminals of the transistors M9 and M11, which are respectively connected to the power supply line via constant current sources CS6 and CS8, are supplied with the drive voltage VCC. Further, the source terminals of the transistors M9 and M11 are respectively connected to the drain terminals of the transistors M5 and M7 in the voltage restriction block 120.

The gate terminals of the transistors M9 and M11 are supplied with voltage VP. The voltage VP is set within the operable range of the constant current sources CS6 and CS8 at a value less than the drive voltage VCC by an amount corresponding to the transistor threshold voltage.

The drain terminals of the transistors M9 and M11 are respectively connected to the drain terminals of the transistors M10 and M12.

The gate terminals of the transistors M10 and M12 are supplied with voltage VN. The voltage VN is set within the operable range of the constant current sources CS6 and CS8 at a value greater than the ground voltage GND by an amount corresponding to the transistor threshold voltage.

The source terminals of the transistors M10 and M12 are respectively connected to the ground line via constant current sources CS7 and CS9. Further, the source terminals of the transistors M10 and M12 are respectively connected to the drain terminals of the transistors M6 and M8 in the voltage restriction block 120.

In the preferred embodiment, the constant current sources CS8 and CS9 respectively function as first and second output current sources, and the constant current sources CS6 and CS7 respectively function as third and fourth output current sources. Further, the transistors M11 and M12 respectively function as first and second output control elements, and the transistors M9 and M10 respectively function as third and fourth output control elements.

A connection node between the transistors M9 and M10 and a connection node between the transistors M11 and M12 respectively function as an output terminal N1, which serves as a second output terminal, and an output terminal N2, which serves as a first output terminal.

The constant current sources CS1 to CS9 respectively generate currents I1 to I9. In the preferred embodiment, the values of the currents I1 to I9 are all fixed (iref).

Figure 2:
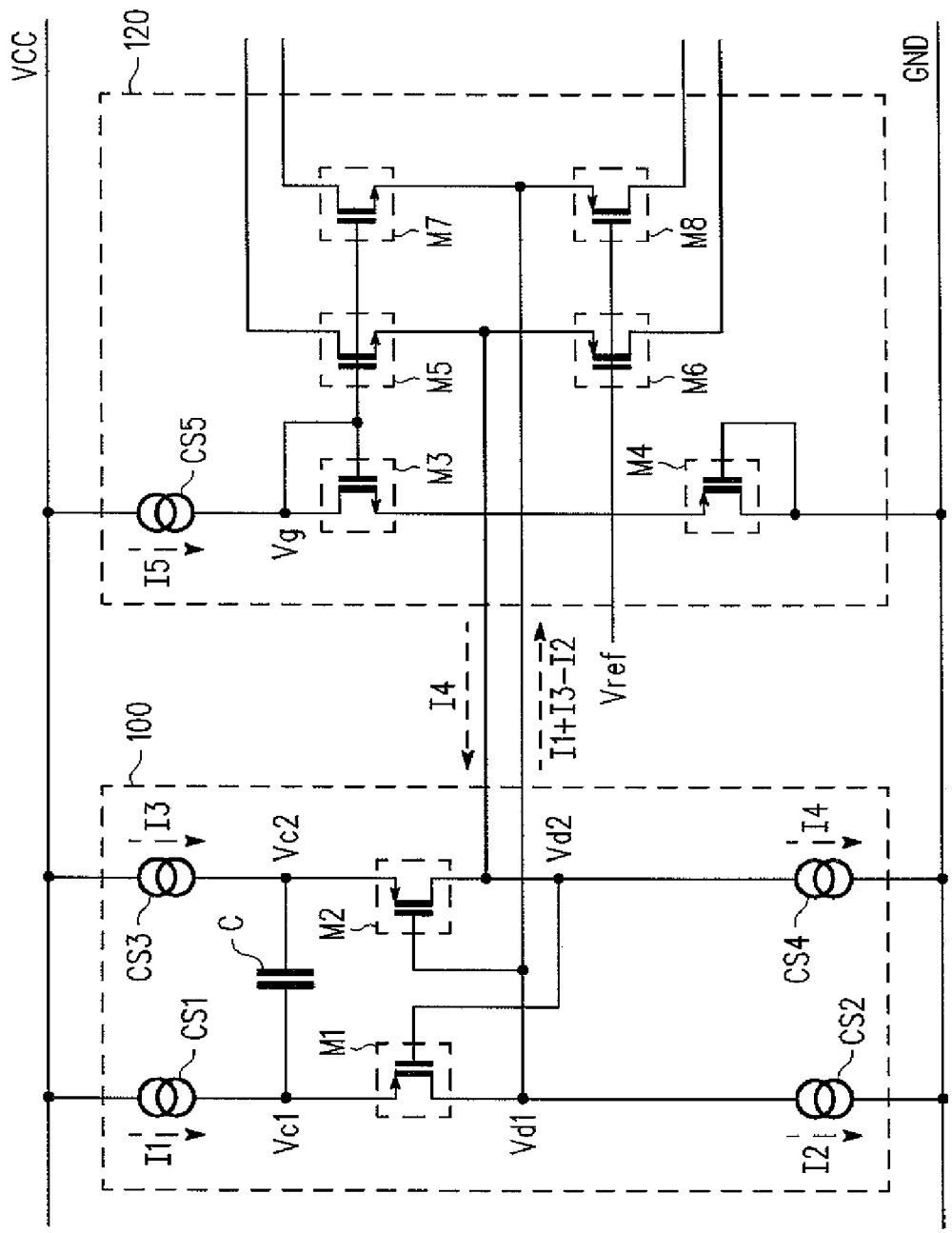
FIG. 2 is a diagram showing the operation of an oscillation core block and a voltage restriction block in the oscillation circuit of FIG. 1.

The operation of the oscillation core block 100 and the voltage restriction block 120 will now be discussed with reference to FIG. 2.

When the transistor M1 goes on and the transistor M2 goes off in the oscillation core block 100, current I1+I3 from the constant current sources CS1 and CS3 flow to the drain terminal of the transistor M1. The constant current source CS2 cancels some of the current. Thus, the voltage restriction block 120 is supplied with current I1+I3−I2. The current I1+I3−I2 is supplied to the transistor M8. Thus, the transistor M8 goes on.

The transistor M2 is off. Thus, the transistor M5 of the voltage restriction block 120 goes on and supplies the constant current source CS4 with current I4.

As a result, voltage Vc1 of the capacitor C at the side of the transistor M1 is expressed as shown below.

$$Vc1 = Vd2 + Vt1 = Vt4 + Vt3 - Vt5 + Vt1$$

Voltage Vd2 refers to the voltage at a connection node between the drain terminal of the transistor M2 and the constant current source CS4. Further, when "i" is a variable, voltage Vti expresses the gate-source voltage when transistor Mi is on.

Voltage Vc2 of the capacitor C at the side of the transistor M2 is expressed as shown below when the time for reaching voltage Vt2+Vref+Vt8 is a variable.

$$Vc2=Vc1+I3/C*(\text{time})$$

When the transistor M2 goes on and the transistor M1 goes off in the oscillation core block 100, current I1+I3 flows to the transistor M2 from the constant current sources CS1 and CS3. The constant current source CS4 cancels some of the current. Thus, the voltage restriction block 120 is supplied with current I1+I3−I4. The current I1+I3−I4 is supplied to the transistor M6. Thus, the transistor M6 goes on.

The transistor M1 is off. Thus, the transistor M7 of the voltage restriction block 120 goes on and supplies the constant current source CS2 with current I2.

As a result, voltage Vc2 of the capacitor C at the side of the transistor M1 is expressed as shown below.

$$Vc2=Vd1+Vt2=Vt4+Vt3-Vt7+Vt2$$

Voltage Vd1 refers to the voltage at a connection node between the drain terminal of the transistor M1 and the constant current source CS2.

Voltage Vc1 of the capacitor C at the side of the transistor M1 is expressed as shown below when the time for reaching voltage Vt1+Vref+Vt6 is a variable.

$$Vc1=Vc2+I1/C*(\text{time})$$

Figure 4:
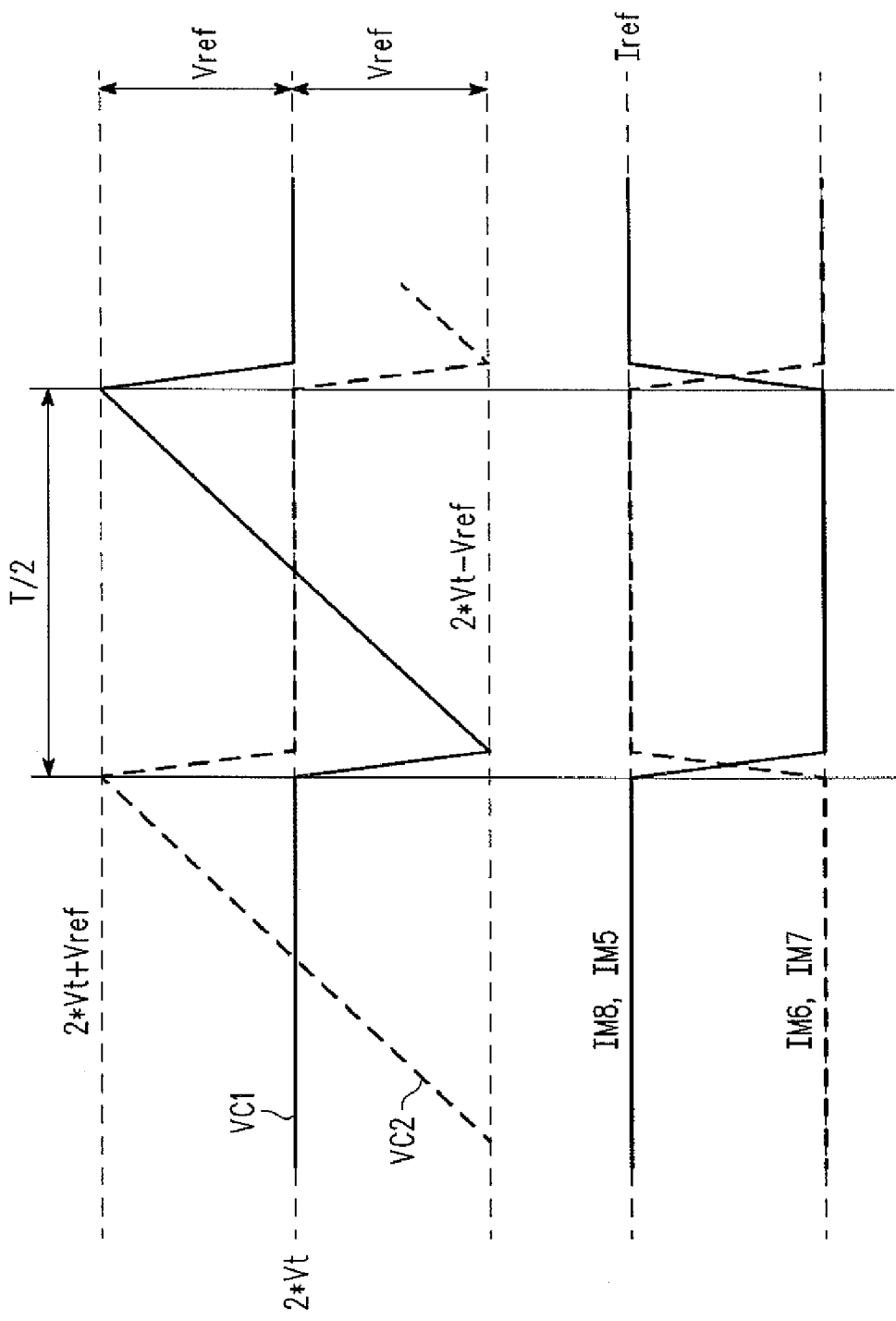
FIG. 4 is a diagram showing the oscillation of the oscillation circuit of FIG. 1.

In the transistors M1 to M8, if voltage Vt=Vt1, . . . , =Vt8, and current Iref=1, . . . , =I8 are satisfied, as shown in FIG. 4, voltage vc and voltage Vc2 alternately swing between voltage 2*Vt+Vref and 2*Vt−Vref so that the oscillation amplitude has the same voltage as the reference voltage Vref. In other words, oscillation is performed with the amplitude of the reference voltage Vref regardless of how big or small the swing of the oscillation core block 100 is.

The rising gradient of each of voltages Vc1 and Vd2 is expressed as Iref/C. The cycle T and frequency F of the oscillation is expressed as described below.

$$Iref*T/2=C*Vref*2$$

$$T=4C*Vref/Iref$$

$$F=1/T=Iref/(4C*Vref)$$

Figure 3:
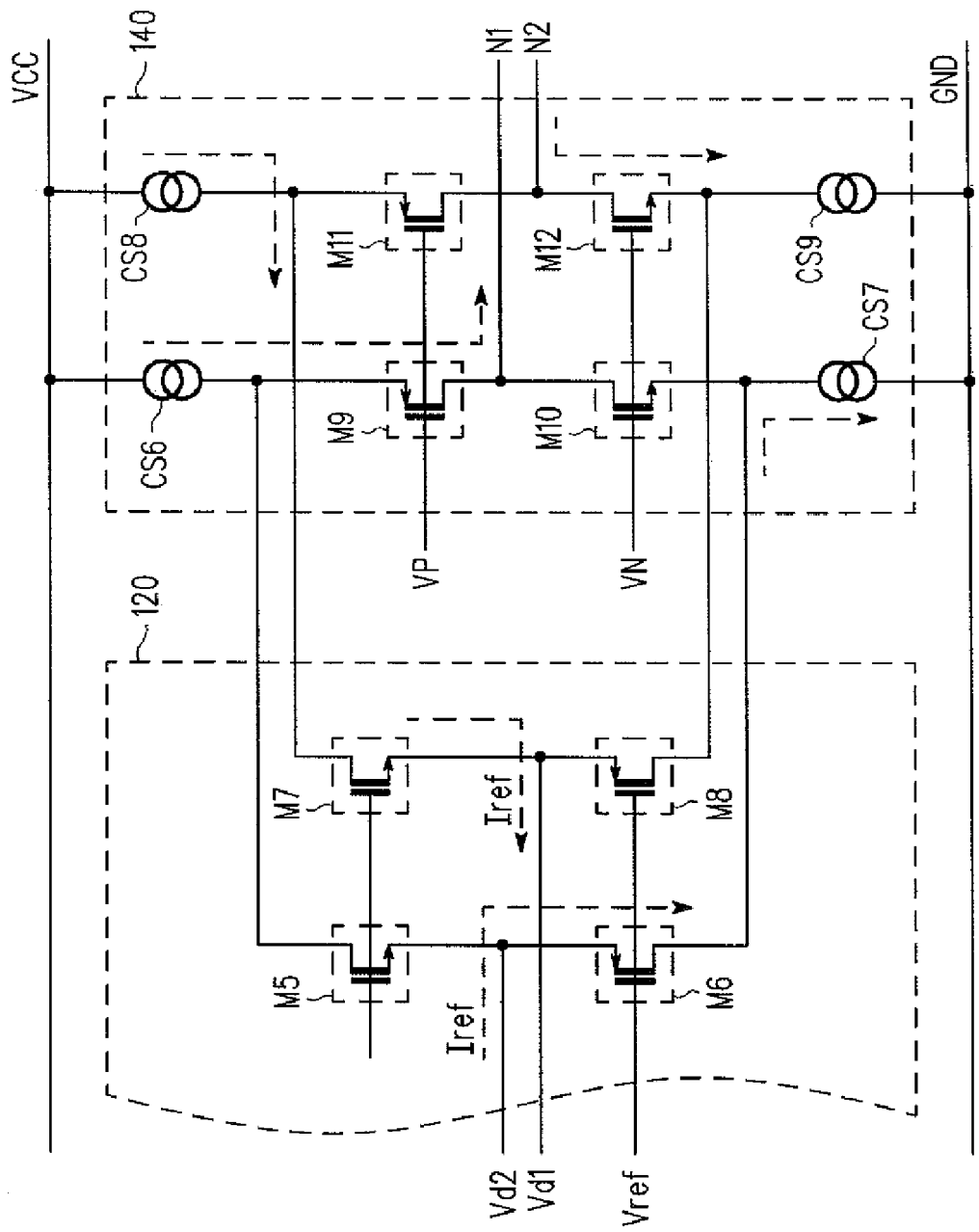
FIG. 3 is a diagram showing the operation of the voltage restriction block and a differential output block in the oscillation circuit of FIG. 1.

The operation of the voltage restriction block 120 and the differential output block 140 will now be discussed with reference to FIG. 3.

When current Iref is supplied from a connection node (voltage Vd2) between the drain terminal of the transistor M2 and the constant current source CS4 to a connection node (voltage Vd1) between the drain terminal of the transistor M1 and the constant current source CS2, the transistor M5 goes off and the current Iref flows to the transistor M6. Further, in this case, the transistor M8 goes off, and current Iref flows to the transistor M7.

Accordingly, current I6 flows to the transistor M9, and current I7−Iref flows to the transistor M10. If current I6 and current I7 have the same values, the current flowing to the transistor M9 would be greater than the current flowing to the transistor M10, and the differential current (more specifically, current Iref) would be supplied to the output terminal N1. This current would increase the voltage at the output terminal N1 to the drive voltage VCC.

If current I8 and current I9 have the same values, the current flowing to the transistor M12 would be greater than the current flowing to the transistor M11, and the differential current would be canceled at the output terminal N2. This current would decrease the voltage at the output terminal N2 to the ground voltage GND.

Once the voltage at the output terminal N1 increases to the drive voltage VCC, current would not flow to the output terminal N1. Thus, the current flowing to the transistor M9 and the current flowing to the transistor M10 would have the same value and be current I7−Iref. The output terminal N2 reaches the ground voltage GND. In the same manner, the current flowing to the transistor M12 and the current flowing to the transistor M11 would have the same value and be current I8−Iref. If the currents I6 to I9 are the same as the current Iref, current would not be consumed in the differential output block 140.

When the oscillation signal is inverted, the voltage at the output terminal N1 decreases to the ground voltage GND, and the voltage at the output terminal N2 increases to the drive voltage VCC. This enables full swing without supplying additional current.

The oscillation circuit of the preferred embodiment has the advantages described below.

In the preferred embodiment, current for restricting voltage is supplied to the differential output block 140. The differential output block 140 uses the current to perform full swing between the ground voltage GND and the drive voltage VCC. In the prior art, the used current is disposed of by a voltage limiter (in the preferred embodiment, voltage restriction block 120). In the oscillation circuit of the present invention, the differential output block 140 effectively uses this current without the supply of additional current and enables full swing. Accordingly, full swing can be realized while reducing power consumption with a simple circuit structure.

In the preferred embodiment, the frequency F is a function of the reference voltage Vref. Accordingly, the frequency F may be controlled by changing the reference voltage Vref.

It should be apparent to those skilled in the art that the present invention may be embodied in many other specific forms without departing from the spirit or scope of the invention. Particularly, it should be understood that the present invention may be embodied in the following forms.

In the preferred embodiment, it is preferable that the constant current sources CS1 to CS9 all be the same. However, even when the constant current sources CS1 to CS9 differ from one another, power may be saved for a common current value.

In the preferred embodiment, a multivibrator oscillation circuit is used as the oscillation core block 100. However, the structure of the oscillation core block 100 is not limited as long as the oscillation signal can be provided.

Figure 5:
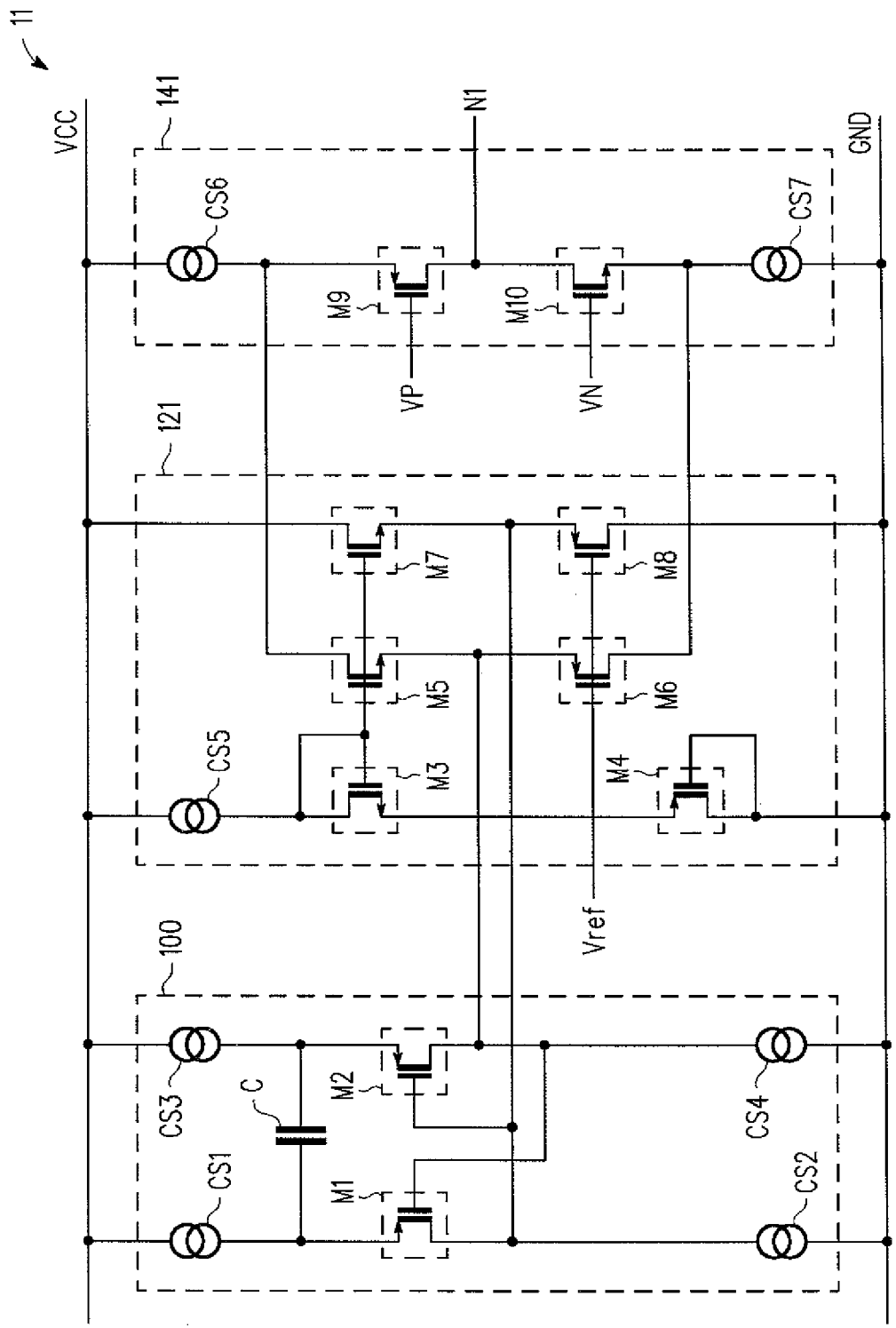
FIG. 5 is a diagram showing the structure of an oscillation circuit according to another embodiment of the present invention.

In the preferred embodiment, two complementary signals are output by using the transistors M11 and M12. Instead, an oscillation circuit 11 show in FIG. 5 may be used to supply a single oscillation signal. Particularly, when there is no need for complementary signals, the oscillation circuit may be realized with a simpler structure.

Figure 6:
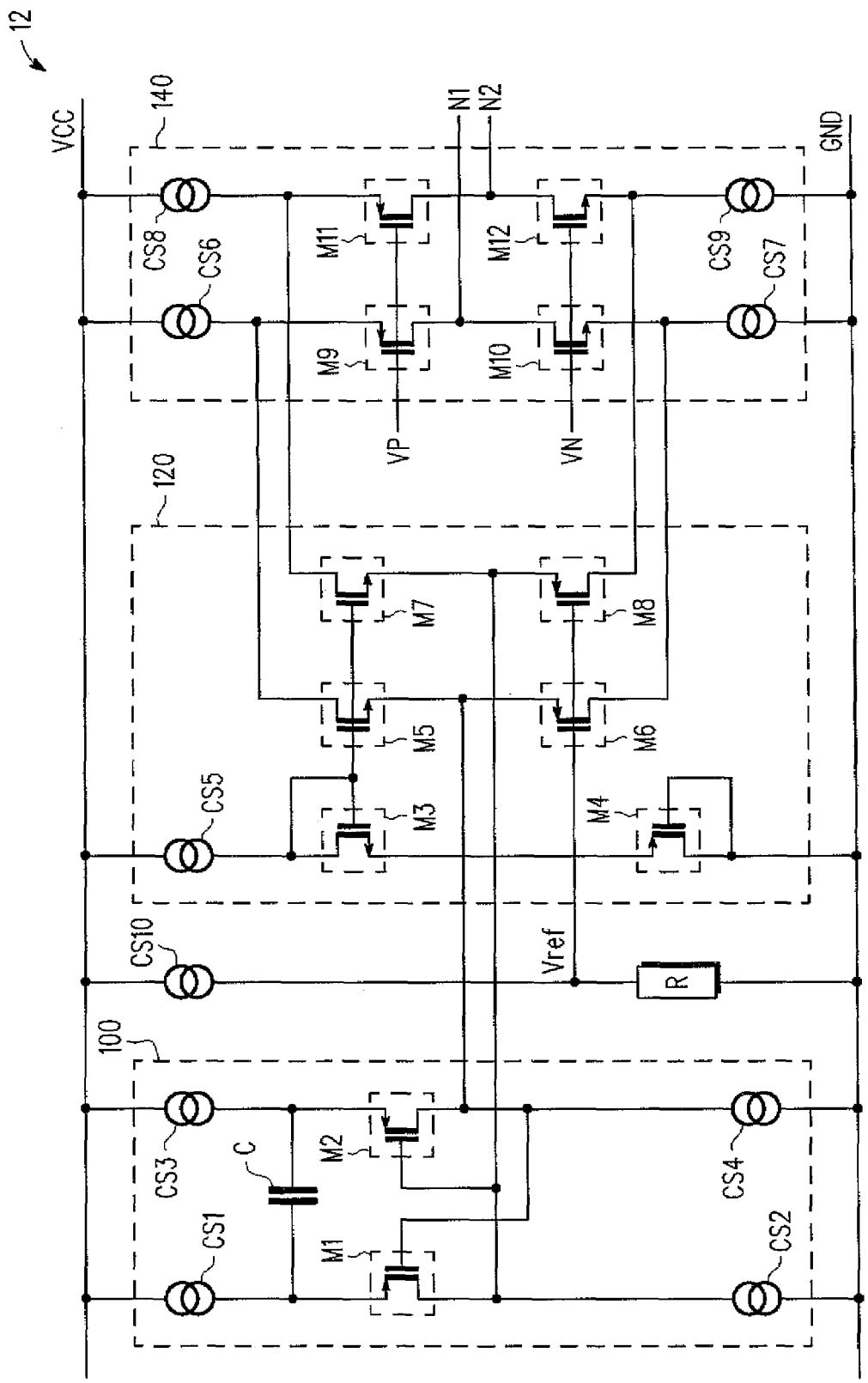
FIG. 6 is a diagram showing the structure of an oscillation circuit according to a further embodiment of the present invention.

In the preferred embodiment, the reference voltage Vref is supplied from an external device. Instead, as shown in FIG. 6, an oscillation circuit 12 may generate the reference voltage vref with a constant current source CS10, which is connected to the drive voltage VCC and which functions as a reference current source, and a resistor R. In this case, as described above, the frequency F is expressed as Iref/(4C*Vref). When substituting Vref with Iref*R, F=1/4CR is satisfied. In this manner, when Iref is used so as to supply current that is a constant times greater than another current in an oscillation circuit, the frequency would not change even if the current changes.

In the preferred embodiment, the voltage of each of the transistors M1 to M8 is such that Vt=Vt1= . . . =Vt8 is satisfied. However, in the present invention, it is only required that Vt1=Vt2, Vt3=Vt5=Vt7, and Vt4=Vt6=Vt8 be satisfied. In this case, swinging occurs between voltage Vt4+Vt3−Vt7+Vt2+Vref and voltage Vt4+Vt3−Vt7+Vt2−Vref.

In the preferred embodiment, the frequency F is controlled by changing the reference voltage Vref using the constant current sources CS1 to CS9 as current sources. Instead, the frequency F may be controlled by changing the current Iref for each current source. The frequency F would become the function of current Iref and be proportional to the current Iref. Thus, each current source would be realized by a current mirror circuit, and the frequency may be easily controlled.

The present examples and embodiments are to be considered as illustrative and not restrictive, and the invention is not to be limited to the details given herein, but may be modified within the scope and equivalence of the appended claims.

The invention claimed is:

1. An oscillator circuit, comprising:
   an oscillation unit for outputting a first oscillation signal;
   a voltage control unit including first and second control elements having source terminals that are connected to each other; and
   an output unit including first and second output control elements, arranged between first and second output current sources, and a first output terminal arranged at a connection node between the first and second output control elements, wherein:
      the first control element has a drain terminal connected to a connection node between the first output current source and the first output control element;
      the second control element has a drain terminal connected to a connection node between the second output control element and the second output current source;
      a connection node between the source terminal of the first control element and the source terminal of the second control element is connected so as to receive the first oscillation signal from the oscillation unit; and
      the first control element has a gate terminal for receiving a predetermined bias, and the second control element has a gate terminal for receiving a reference voltage for determining an amplitude of an oscillation signal.

2. The oscillator circuit of claim 1, wherein:
the oscillation unit includes a first oscillation control element having a source terminal and a drain terminal respectively connected to first and second oscillation current sources; and
the oscillation unit is configured so that current supplied to the first and second oscillation current sources and current supplied to the first and second output current sources have the same value.

3. The oscillator circuit of claim 1, wherein:
the oscillation unit is a multivibrator oscillation circuit and outputs a second oscillation signal in addition to the first oscillation signal;
the voltage control unit further includes third and fourth control elements having source terminals that are connected to each other;
the output unit further includes third and fourth output control elements, arranged between third and fourth output current sources, and a second output terminal arranged at a connection node between the third and fourth output control elements;
the third control element has a drain terminal connected to a connection node between the third output current source and the third output control element;
the fourth control element has a drain terminal connected to a connection node between the fourth output control element and the fourth output current source;
a connection node between the source terminal of the third control element and the source terminal of the fourth control element is connected so as to receive the second oscillation signal from the oscillation unit; and
the third control element has a gate terminal for receiving a predetermined bias, and the fourth control element has a gate terminal for receiving the reference voltage for determining the amplitude of the oscillation signal.

4. The oscillator circuit according to claim 1, wherein:
the oscillation unit includes a second oscillation control element having a source terminal and a drain terminal respectively connected to the third and fourth oscillation current sources; and
the oscillation unit is configured so that current supplied to the second and third oscillation current sources and current supplied to the second and third output current sources have the same value.

5. The oscillator circuit according to claim 1, wherein:
the voltage control unit includes a resistor and a reference current source for generating the reference voltage, with the reference current source supplying current having a value that is a constant times greater than the value of the current supplied from each output control element.

* * * * *